United States Patent
Nagashima et al.

(10) Patent No.: US 7,087,307 B2
(45) Date of Patent: Aug. 8, 2006

(54) GLASS SHEET AND GLASS SHEET PHOTOELECTRIC CONVERTER DEVICE

(75) Inventors: Yukihito Nagashima, Osaka (JP); Masahiro Hirata, Osaka (JP); Akihiro Koyama, Osaka (JP); Akira Fujisawa, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 133 days.

(21) Appl. No.: 10/485,633

(22) PCT Filed: Dec. 27, 2002

(86) PCT No.: PCT/JP02/13765

§ 371 (c)(1),
(2), (4) Date: Feb. 3, 2004

(87) PCT Pub. No.: WO03/057638

PCT Pub. Date: Jul. 17, 2003

(65) Prior Publication Data

US 2004/0180218 A1    Sep. 16, 2004

(30) Foreign Application Priority Data

Dec. 28, 2001  (JP) ............................. 2001-401441
Dec. 11, 2002  (JP) ............................. 2002-358988

(51) Int. Cl.
*B32B 17/06* (2006.01)

(52) U.S. Cl. ...................... 428/432; 428/697; 428/701; 428/702; 501/55; 501/65; 501/66; 501/68; 501/69; 501/72

(58) Field of Classification Search ................ 428/432, 428/697, 701, 702; 501/55, 65, 66, 68, 69, 501/72
See application file for complete search history.

(56) References Cited

U.S. PATENT DOCUMENTS

| | | | |
|---|---|---|---|
| 5,030,594 A | 7/1991 | Heithoff | |
| 5,925,583 A * | 7/1999 | Yoshii et al. | ............ 501/70 |
| 6,101,845 A | 8/2000 | Kojima et al. | |
| 6,313,052 B1 * | 11/2001 | Nakashima et al. | ........ 501/69 |
| 6,355,353 B1 * | 3/2002 | Hyodo et al. | .......... 428/432 |
| 6,380,480 B1 * | 4/2002 | Norimatsu et al. | ....... 136/256 |
| 6,461,736 B1 * | 10/2002 | Nagashima et al. | ...... 428/432 |

FOREIGN PATENT DOCUMENTS

| | | |
|---|---|---|
| EP | 1 116 699 | 7/2001 |
| JP | 4-228450 | 8/1992 |

(Continued)

*Primary Examiner*—Jennifer McNeil
*Assistant Examiner*—G. Blackwell
(74) *Attorney, Agent, or Firm*—Hamre, Schumann, Mueller & Larson, P.C.

(57) ABSTRACT

The present invention provides a glass sheet formed on molten tin, that exhibits a high transmittance that is originally inherent to its composition. In this glass sheet, the difference between a visible light reflectance of a surface formed in contact with the molten tin and a visible light reflectance of a surface on the opposite side thereof is not greater than 0.25%. And when the glass sheet's thickness is 4 mm, a light transmittance at 540 nm wavelength is at least 91.5%, and a light transmittance at 450 nm wavelength is at least 91.0%, and after irradiating UV light for 6 hours as specified in the radiation-proofing test according to JIS R3212, a light transmittance at 540 nm wavelength is at least 91.0% and a light transmittance at 450 nm wavelength is at least 90.5%.

14 Claims, 2 Drawing Sheets

FOREIGN PATENT DOCUMENTS

| | | |
|---|---|---|
| JP | 5-221683 | 8/1993 |
| JP | 9-295819 | 11/1997 |
| JP | 11-298030 | 10/1999 |
| JP | 2001-026437 | 1/2001 |

* cited by examiner

GLASS SHEET AND GLASS SHEET PHOTOELECTRIC CONVERTER DEVICE

TECHNICAL FIELD

The present invention relates to glass sheets formed on molten tin, and more particularly to glass sheets for photoelectric conversion devices that are used in photoelectric conversion devices, such as solar cells.

BACKGROUND ART

In photoelectric conversion devices, glass sheets with high transmittance and superior durability are used widely as the base material for the side on which light is incident. The glass sheets are used as cover glass for protecting the photoelectric conversion elements and as the substrate on which the photoelectric conversion elements are formed. In the former type of glass sheets, photoelectric conversion elements made of crystalline silicon or the like are layered on the glass sheet with a resin film made of EVA (ethylene-vinyl acetate copolymer) disposed in between, for example. In the latter type of glass sheets, photoelectric conversion elements made of thin-film silicon or the like are formed on the surface of the glass sheet with a transparent conductive film disposed in between (see for example JP H11-298030A).

A high transmittance is desired for these glass sheets. In order to increase the transmittance, coloring due to iron components in soda-lime glass may be suppressed by using a raw material with high purity. For example, JP H4-228450A discloses soda-lime glass with low iron components. This glass is a transparent glass with colored edge that contains, in mass %, less than 0.2% total iron oxide in terms of $Fe_2O_3$ as colorant, and wherein the ratio of ferrous oxide (FeO) to total iron oxide is at least 0.4. At a thickness of 5.66 mm, this glass has a light transmittance (illumination C) of at least 87%.

In order to obtain soda-lime glass having a light tint and a high transmittance while including the ordinary amount of iron oxide, it has been proposed to add an oxidizer such as cerium oxide, and to thus lower the content of FeO, which is the principal component responsible for coloring and decrease in transmittance. For example, JP H5-221683A discloses that the $Fe^{2+}/Fe^{3+}$ ratio in the glass can be lowered from the ordinary level (about 38%) to 3 to 10% by including 0.1 to 0.5 wt % of $CeO_2$ as oxidizer in ordinary transparent soda-lime glass containing 0.06 to 0.12 wt % of iron impurities in terms of $Fe_2O_3$. Thus, a high transmittance is attained in a wavelength region of around 600 nm and higher.

Thus, conventionally it has been attempted to improve the glass sheets for photoelectric conversion devices by restricting the total amount of iron oxide or by controlling the oxidation/reduction state (i.e. the $Fe^{2+}/Fe^{3+}$ ratio) of the iron oxide. These glass sheets ordinarily are manufactured by the so-called float process, in which the molten glass are poured onto molten tin kept in a tin float bath, and formed into a glass sheet on that molten tin. However, according to an analysis performed by the inventors, the transmittance of soda-lime glass manufactured by the float process remains at a value that is lower than what theoretically could be accomplished with the glass composition.

Other processes for manufacturing glass sheets besides the float process are known, such as the roll-out process, the down-draw process or glass shaping on a thin layer of water vapor (see for example JP H9-295819A). However, considering the required size of the glass sheet and the manufacturing costs, the float process is even today still the most advantageous manufacturing process not only for main applications in building and vehicle glass sheets etc., but also in photoelectric conversion devices.

DISCLOSURE OF THE INVENTION

It is thus an object of the present invention to provide a glass sheet that can exhibit the high transmittance that is originally inherent in its composition.

In glass sheets formed by the float process, the surface that has been formed in contact with the molten tin includes trace components that have diffused from the molten tin. Due to these trace components, the refractive index at the surface of the glass sheet that has been formed in contact with the molten tin (bottom surface) becomes slightly higher than the refractive index inherent in the glass composition. Therefore, the light reflectance at the bottom surface becomes relatively higher (for example about 0.5%) than the light reflectance at the surface on the opposite side that has not been formed in contact with the molten tin (top surface).

Furthermore, the trace components at the bottom surface contribute to changes in the light transmittance of the glass sheet over time, in particular contribute to a decrease of the light transmittance of the glass sheet when it is exposed to UV light.

In one aspect of the present invention, a glass sheet is presented in which the trace components at the bottom surface have been controlled. In this glass sheet, which is formed on molten tin, the difference between a visible light reflectance of the bottom surface and a visible light reflectance of the top surface is not greater than 0.25%, preferably not greater than 0.15%, and when the glass sheet's thickness is 4 mm, a light transmittance at 540 nm wavelength is at least 91.5%, and a light transmittance of at 450 nm wavelength is at least 91.0%, and after irradiating UV light for 6 hours as specified in the radiation-proofing test according to Japanese Industrial Standard (JIS) R3212, a light transmittance at 540 nm wavelength is at least 91.0% and a light transmittance at 450 nm wavelength is at least 90.5%.

Throughout this specification, "reflectance" of a surface of the glass sheet is defined as the value not including the reflection from the surface opposite the surface of interest (that is, the surface on the rear side).

It should be noted that in the glass sheet according to the present invention, even though changes in the transmittance over time are suppressed more than in the related art, they are not completely eliminated. Also in glass sheets to which the present invention has been applied, after long-term usage as a component in a photoelectric conversion device, the transmittance may decrease slightly due the influence of UV light. However, be it the UV light included in sunlight or the UV light from a UV light lamp as specified by the above-noted JIS, the influence of UV light irradiation on the transmittance can be eliminated by baking. To eliminate this influence, baking in air at 500° C. for 30 min is sufficient.

The present invention encompasses glass sheets in which the light transmittance after baking under these conditions has at least the above-noted values (at least 91.5% at 540 nm wavelength, and at least 91.0% at 450 nm wavelength), and the light transmittance after subsequently carrying out the above-noted UV light irradiation test has at least the above-noted values (at least 91.5% at 540 nm wavelength, and at least 90.5% at 450 nm wavelength),

EMBODIMENTS OF THE INVENTION

Figure 1:
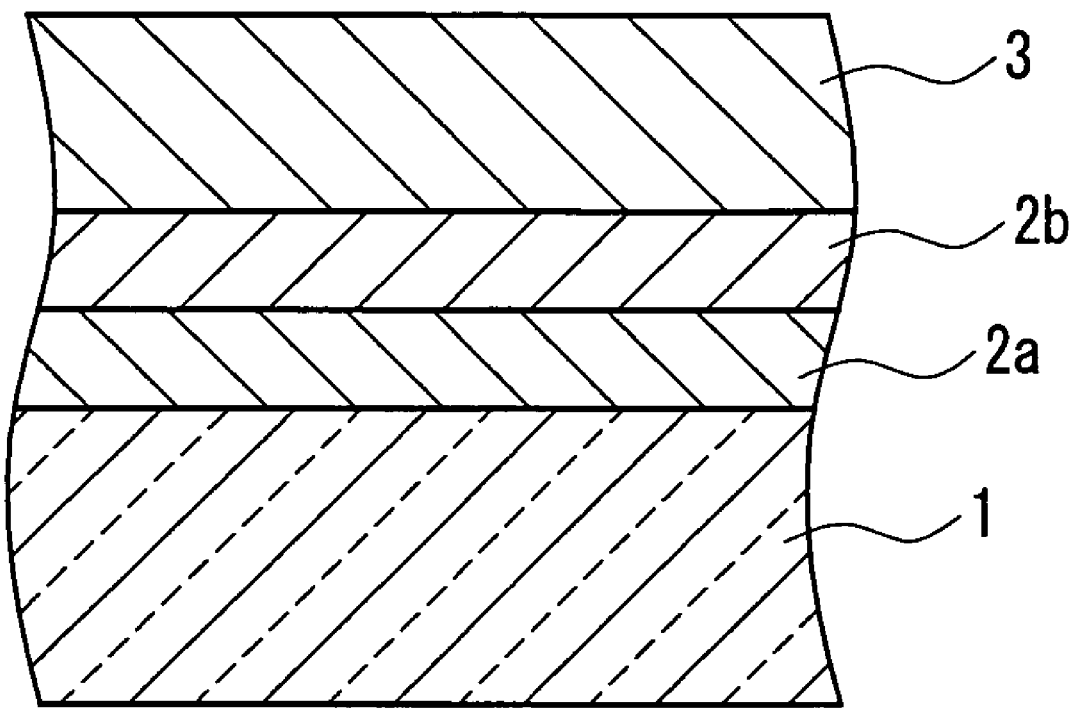
FIG. 1 is a cross-sectional view showing an example of a glass sheet for a photoelectric conversion device in accordance with the present invention.

In glass sheets manufactured by the float process (i.e., in float glass), trace components originating from the molten tin make it possible to distinguish the bottom surface from the top surface of the glass. The present invention suppresses an increase in trace components that contribute to a rise of the refractive index of the glass, and in particular an increase of the concentration of tin oxide and iron oxide near the bottom surface. However, the diffusion itself of trace components into the bottom surface is not entirely prevented, and thus it is still possible to distinguish bottom surface and top surface, as in the prior art.

As is widely known, the precise measurement of trace components in small regions is not easy, and the measured values may not match completely, due to differences in the resolution of the analytical procedures for example. Throughout this specification, trace components (tin oxide, iron oxide) near the bottom surface are specified on the basis of the values measured by a wavelength dispersive X-ray detector (WDX) mounted to an electron probe micro-analyzer (EPMA), which is one of the ordinary methods for the quantitative analysis of surfaces.

In the glass sheet of the present invention, it is preferable that the maximum value of the tin oxide concentration in terms of $SnO_2$ (that is, converting the Sn that is ordinarily present in bivalent and tetravalent form into tetravalent) up to a depth of 10 μm from the bottom surface is not more than 1 mass %. Moreover, it is preferable that the maximum value of the iron oxide concentration in terms of $Fe_2O_3$ (that is, converting the Fe that is ordinarily present in bivalent and trivalent form into trivalent) from the bottom surface is not more than 0.2 mass %.

Controlling the concentration of these trace components, the visible light reflectance at the bottom surface can be reduced to a value not greater than 4.5%. Restricting the concentration of at least the tin oxide to the level indicated above, the visible light reflectance at the bottom surface can be reduced to a value not greater than 4.25%. Moreover, controlling both the tin oxide concentration and the iron oxide concentration, it becomes possible to reduce the visible light reflectance at the bottom surface to a value not greater than 4.15%. Thus, a glass sheet can be obtained in which the visible light reflectance at the bottom surface and the top surface is not greater than 4.5%, preferably not greater than 4.25% and even more preferably not greater than 4.15%.

By restricting the trace components diffused from the bottom surface, the transmittance of the glass sheet can be kept high, while at the same time restricting also temporal changes in the transmittance. In particular reductions of the transmittance due to UV light, small as they may be, have a large effect on the photoelectric conversion efficiency of photoelectric conversion devices. Applying the present invention, in a glass sheet of 4 mm thickness, the changes in light transmittance at 540 nm wavelength before and after irradiating UV light, as specified in the radiation-proofing test according to JIS R3212, can be restricted to not more than 5%, or even not more than 4%. Also the changes in light transmittance at 450 nm wavelength can be restricted to not more than 5%, or even not more than 4%.

The amount of tin oxide included near the bottom surface is affected by the purity of the molten tin. To decrease the tin oxide concentration near the bottom surface, the reducibility of the atmosphere in the tin float bath should be kept high, at such a level that oxidizing gas does not even partially oxidize the molten tin when such oxidizing gas is leaked into the tin float bath. Ordinarily, nitrogen gas and hydrogen gas are supplied to the tin float bath, but trace amounts of tin oxide may be generated in the molten tin due to the leak of trace amounts of oxidizing gas, such as oxygen. Under ordinary operating conditions, this tin oxide can be tolerated if its amount is so small that it does not negatively affect the forming of the glass sheets. However, to satisfactorily suppress the diffusion of tin oxide into the bottom surface of the glass sheet, it is necessary to reliably suppress the generation of tin oxide in the molten tin. A reliable suppression of the oxidation of the molten tin can be achieved by raising the hydrogen concentration and raising the gas pressure in the bath.

To reduce the iron oxide concentration near the bottom surface, the iron concentration in the molten tin should be reduced. It is preferable that the iron concentration in the molten tin is not greater than 100 ppm, but it does not need to be too low, and for example at least 55 ppm and less than 100 ppm is appropriate.

With the present invention, increases in reflectance due to compositional fluctuations near the surface can be suppressed, so that the inherent transmittance of the glass composition can be more easily attained. In order to attain a high transmittance, it is preferable that the amount of iron oxide in the glass composition is low, more specifically, that the amount of iron oxide total in terms of $Fe_2O_3$ is not greater than 0.04 mass %, and in particular not greater than 0.02 mass %. In this case, it is preferable that the glass composition is substantially free from cerium oxide. Throughout this specification, "substantially free from" means that an admixture of trace amounts is tolerable and refers to ranges of not greater than 0.001 mass %, for example.

Both bivalent iron oxide ($Fe^{2+}$) and trivalent iron oxide ($Fe^{3+}$) is present in the glass. Bivalent iron has a high absorptivity in the wavelength region at about 1 μm and up to visible wavelengths, whereas trivalent iron has a relatively low absorptivity in the visible shorter wavelength region of 400 to 500 nm.

When cerium oxide is included together with iron in the glass, then the photochemical reaction $Ce^{3+}+Fe^{3+} \rightarrow Ce^{4+}+Fe^{2+}$ is brought about by the UV light included in sunlight. When this reaction occurs, then the transmittance both in the shorter wavelength region and the longer wavelength region is decreased.

As described above, near the bottom surface in particular, glass sheets manufactured by the float process contain trace components not originating from the glass raw materials, which have diffused from the outside. The above-noted glass composition means strictly speaking the composition without those trace components. This composition can be known from the rest excluding the surface portion near the surface of the glass sheet, for example the rest excluding the portion of up to 10 μm depth from the surface of the glass sheet. Throughout this specification, the composition of this rest is referred to as bulk composition of the glass.

The bulk composition of the glass sheet of the present invention is typically a composition called soda-lime glass. Expressed in mass %, this composition includes for example, in addition to the above-noted extent of iron (preferably not more than 0.04 mass % in terms of $Fe_2O_3$):

65 to 80% $SiO_2$,
0 to 5% $Al_2O_3$,
0 to 10% MgO,
5 to 15% CaO,
10 to 18% $Na_2O$,
0 to 5% $K_2O$,
5 to 15% MgO+CaO,
10 to 20% $Na_2O+K_2O$,
0.05 to 0.3% $SO_3$, and
0 to 5% $B_2O_3$.

$SiO_2$ is the principal component forming the network of the glass. If there is less than 65 mass % $SiO_2$, then the durability of the glass is decreased, and if there is more than 80 mass %, then the glass becomes difficult to melt.

$Al_2O_3$ is a component that improves the durability of the glass, but if it exceeds 5 mass %, then the glass becomes difficult to melt. Preferably, it is in a range of 0.1 to 2.5 mass %.

MgO and CaO are used to improve the durability of the glass and to adjust the liquidus temperature and viscosity during forming. If the MgO exceeds 10 mass %, then the liquidus temperature increases. If the CaO is less than 5 mass % or more than 15 mass %, then the liquidus temperature increases. If the total of MgO and CaO is less than 5 mass %, then the durability of the glass is reduced, and if it exceeds 15 mass %, then the liquidus temperature increases.

$Na_2O$ and $K_2O$ are used as melt accelerators. If there is less than 10 mass % $Na_2O$ or the total of $Na_2O$ and $K_2O$ is less than 10 mass %, then the effect of accelerating melting is poor, and if there is more than 18 mass % $Na_2O$ or the total of $Na_2O$ and $K_2O$ exceeds 20 mass %, then the durability of the glass decreases. Since the raw materials of $K_2O$ is more expensive than those of $Na_2O$, it is preferable that it does not exceed 5 mass %.

$SO_3$ is a component that enhances the refining of the glass. If there is less than 0.05 mass %, then the refining effect with ordinary melt processes becomes insufficient and if there is more than 0.30 mass %, then the $SO_2$ generated by its decomposition tends to remain in the glass as bubbles or bubbles tend to be generated due to reboiling. A preferable range is less than 0.15 mass %.

$B_2O_3$ is a component that is used to improve the durability of the glass, or also as a melting aid. If there is more than 5 mass % $B_2O_3$, then problems occur during forming due to the volatilization of the $B_2O_3$, so that 5 mass % is taken as an upper limit.

The glass sheet of the present invention has the property that it is suitable as a component of a photoelectric conversion device. The glass sheet may be used as a cover glass sheet, or as a substrate on which the photoelectric elements are formed. In the latter case, after previously depositing at least a conductive film serving as a front electrode, the photoelectric elements and a metal film serving as a rear electrode may be fabricated on the conductive film in this order.

As the conductive film, a thin film whose principal component is tin oxide, indium oxide or zinc oxide may be used, but a thin film whose principal component is tin oxide to which impurities such as fluorine or antimony have been added is preferable. In this specification, "principal component" means a component that accounts for at least 50 mass %. The sheet resistance of the conductive film is preferably 5 to 15 Ω/square (Ω/□). In consideration of this, a preferable film thickness of the conductive film is 500 to 2000 nm, and in particular 500 to 1500 nm.

An undercoating film may be interposed between the substrate and the conductive film. An example of a preferable undercoating film is a double-layer undercoating film, in which a first undercoating layer with a refractive index of 1.6 to 2.5 and a thickness of 5 nm to 100 nm, and a second undercoating layer with a refractive index of 1.4 to 2.0 and a thickness of 5 nm to 100 nm are layered in that order onto the substrate. These undercoating films reduce the reflectance and the reflection interference colors, and moreover suppress the diffusion of alkali components contained in the glass sheet into the conductive film.

It is preferable that the principal component of the first undercoating layer, which contacts the substrate, is at least one selected from tin oxide, titanium oxide, zinc oxide and aluminum oxide. It is preferable that the principal component of the second undercoating layer is at least one selected from silicon oxide, aluminum oxide, silicon oxynitride, silicon carbide and tin oxide. If the undercoating film is too thin, then the effect of preventing the diffusion of alkali components cannot be adequately displayed. On the other hand, if it is too thick, then the effect of reducing the reflectance cannot be adequately displayed.

FIG. 1 is a cross-sectional view of an example of a glass sheet for a photoelectric conversion device according to the present invention. A first undercoating layer 2a, a second undercoating layer 2b, and a conductive film 3 are deposited in this order on a glass sheet 1. The thin films 2a, 2b and 3 may be deposited on the bottom surface, but are preferably deposited on the top surface of the glass sheet 1.

The thin films, such as the conductive film, may be deposited by sputtering or the like, but it is preferable that they are deposited by a process involving the thermal decomposition of a film-forming raw material, such as CVD (chemical vapor deposition) or spraying. Here, spraying includes solution spraying, in which the raw material is supplied in liquid form, and powder spraying, in which it is supplied in solid form. In CVD, a film-forming raw material (for example tin raw material) in the gaseous state and a reactive gas (oxidation raw material) may be supplied via different pathways such that they react near the substrate, but it is also possible simultaneously to supply a separating gas between the film-forming raw material in the gaseous state and the reaction gas.

For the CVD process, it is possible to use a process in which the film-formation raw material is supplied to the surface of a glass sheet that has been previously severed and heated to a high temperature (for example 615° C. or higher), but it is possible to use so-called online CVD, in which a film is deposited on the glass ribbon in the tin float bath during the glass manufacturing step in the float process, which is preferable with regard to energy efficiency and film deposition over a large area. Using this method, a film can be deposited on a high-temperature glass ribbon of about 620 to 750° C.

When online CVD is used, the conductive film is deposited on the top surface of the glass sheet, so that the bottom surface of the glass sheet will be on the side of the photoelectric conversion device on which the light is incident. Consequently, in this photoelectric conversion device glass sheet, it becomes particularly important to reduce the reflectance at the bottom surface of the glass sheet. The present invention presents a glass sheet for a photoelectric conversion device that includes, from one side, a glass sheet of the present invention and a conductive film deposited on the top surface of this glass sheet.

FIG. 1 shows an example of an apparatus of online CVD. With this apparatus, molten glass raw material is supplied from a melting tank (float furnace) 11 to a tin float bath (float bath) 12, and this raw material is formed into a band-shaped glass ribbon 10 on the tin bath 15. Moreover, a predetermined number of coaters 16 (in the embodiment shown in the drawing, there are three coaters 16a, 16b and 16c) is arranged in the tin float bath 12, gaseous raw material is supplied from these coaters, and continuous thin films are deposited on the glass ribbon 10.

Using a plurality of coaters, it is possible to continuously deposit a plurality of layers including a conductive film, for example an undercoating film and a conductive film, in that order on the glass ribbon 10. After the thin films have been deposited, the glass ribbon 10 is lifted up by a roller 17, and is fed into an annealing lehr 13. The glass ribbon that has been annealed in the annealing lehr 13 is cut into glass sheets of predetermined size by a cutting device that is not shown in the drawings.

It is also possible to deposit the conductive film using both online CVD and spraying. For example, it is conceivable to carry out online CVD and spraying in that order (for example by forming a film by CVD in the tin float bath, and forming a film by spraying at a stage downstream from that bath.)

Examples of the tin raw material that can be used in a thermal decomposition process are stannous chloride and stannic chloride, wherein the latter is easier to handle and more stable than the former. It is also possible to use organic tin compounds such as dimethyltin dichloride, monobutyltin trichloride as the tin raw material. These organic tin compounds are preferable in that their reactivity is lower than that of stannic chloride. As the reactive gas (oxidation raw material), water vapor, oxygen or a suitable combination thereof may be used. Water vapor is convenient in that it breaks down the tin chloride raw material in a hydrolysis reaction. It is also possible to use air or an alcohol such as methyl alcohol or ethyl alcohol as the oxidation raw material.

In order to improve the conductivity of the tin oxide film, antimony or fluorine may be added. Examples of antimony raw materials are antimony trichloride and antimony pentachloride, and examples of fluorine raw materials are hydrogen fluoride, trifluoroacetic acid, bromotrifluoromethane, chlorodifluoromethane and the like. In order to increase the conductivity, it is preferable to add fluorine. Preferably the fluorine concentration in the conductive film is not greater than 0.2 mass %. In this case, the refractive index of the fluorine-doped tin oxide film becomes about 1.9. It should be noted that this conductive film may also contain other trace components, such as silicon, aluminum, zinc, copper, indium, bismuth, gallium, boron, vanadium, manganese, or zirconium. However, it is preferable that the concentration of these trace components is not greater than 0.02 mass %.

If a thin film having silicon oxide as its principal component is deposited by CVD, then it is possible to use monosilane, disilane, trisilane, monochlorosilane, dichlorosilane, 1,2-dimethylsilane, 1,1,2-trimethyldisilane, 1,1,2,2,-tetramethylsilane, tetramethylorthosilicate, or tetraethylorthosilicate as the silicon raw material. Suitable examples of the oxidation raw material for this case include oxygen, water vapor, dry air, carbon dioxide, carbon monoxide, nitrogen dioxide, and ozone. In order to prevent a reaction of the silane until it reaches the glass surface, it is possible to use in addition an unsaturated hydrocarbon gas, such as ethylene, acetylene or toluene.

If a thin film having aluminum oxide as its principal component is depositeted by CVD, then it is possible to use trimethylaluminum, aluminum triisopropoxide, diethylaluminum chloride, aluminum acetylacetonate and aluminum chloride, as the aluminum raw material. Examples of suitable oxidation raw materials for this case include oxygen, water vapor and dry air.

EXAMPLES

The following is a more detailed explanation of the present invention by way of examples, but the present invention is in no way limited to these examples.

A raw material was prepared such that the bulk composition of the glass becomes as listed in Table 1. This raw material was melted in a melting tank, poured into tin float baths holding various kinds of molten tin with different iron contents and cleanliness, and thus formed to a thickness of about 4 mm. These glass ribbons were cooled down in an annealing lehr, and cut further downstream. Thus, the glass sheets of the Examples 1 to 4 were obtained.

TABLE 1

| component | mass % |
| --- | --- |
| $SiO_2$ | 71.5 |
| $Al_2O_3$ | 1.5 |
| MgO | 4 |
| CaO | 8 |
| $Na_2O$ | 14 |
| $K_2O$ | 0.8 |
| $SO_3$ | 0.2 |
| iron oxide total | 0.015 |

*That 100% is exceeded is due to discrepancies in the number of significant digits.

In Example 1 to 4, the iron concentration in the molten tin, the degree of cleanliness of the molten tin, the maximum values of the tin oxide concentration and the iron oxide concentration near the bottom surface, the visible light reflectance at the bottom surface, the difference between the visible light reflectances at the bottom surface and the top surface, and the transmittance at 540 nm and 450 nm before and after irradiating UV light for 6 hours, as specified in the radiation-proofing test according to JIS R3212 were measured. The results are listed in Table 2.

The iron concentration in the molten tin was measured by cooling and solidifying samples of molten tin, dissolving it in hydrochloric acid, and performing a glow discharge emission spectral analysis on the resulting solution. For the cleanliness of the molten tin, a downstream portion in the tin float bath was observed visually, and if tin oxide floated on the molten tin, then it was determined to be "polluted" and if there was no floating tin oxide, then it was determined to be "clean." In Example 1 and Example 2, the ratio of hydrogen gas to nitrogen gas supplied to the tin float bath was maintained at a level higher than in the prior art, to the extent that no tin oxide could be observed.

The concentration of tin oxide and iron oxide near the bottom surface was measured by WDX analysis (acceleration voltage: 15 kV, sample current: $2.5 \times 10^{-7}$ A, scan speed: 6 μm/min, analyzing crystal: Sn/PET,Fe/LiF) with an EPMA (JXA8600 by JEOL, Ltd.)

The visible light reflectance was measured by fabricating samples by grinding the rear surfaces of the glass sheets such that they had a 5° inclination with respect to the surfaces of the front side, applying a non-reflective coating to the rear surfaces, and measuring these samples with a spectrophotometer (UV-3100 PC by Shimadzu Corp.) Also the transmittance at predetermined wavelengths was measured with this spectrophotometer.

TABLE 2

|  | Ex. 1 | Ex. 2 | Ex. 3 | Ex. 4 |
| --- | --- | --- | --- | --- |
| Concentration of iron in molten tin (ppm) | 90 | 160 | 95 | 210 |
| cleanliness of molten tin | clean | clean | poll. | poll. |
| maximum value of tin oxide concentr. (wt %) | 0.71 | 0.88 | 2.35 | 3.40 |
| maximum value of iron oxide concentr. (wt %) | 0.15 | 0.35 | 0.15 | 0.48 |
| reflectance of bottom surface (%) | 4.1 | 4.2 | 4.4 | 4.6 |
| reflectance difference between bottom/top surface | 0.1 | 0.2 | 0.2 | 0.5 |
| transm. at 540 nm (%) | | | | |
| before UV irradiation | 91.7 | 91.6 | 91.6 | 91.3 |
| after UV irradiation | 91.4 | 91.2 | 91.3 | 90.7 |
| transm. at 450 nm (%) | | | | |
| before UV irradiation | 91.4 | 91.3 | 91.3 | 91.0 |
| after UV irradiation | 91.0 | 90.6 | 90.9 | 90.2 |

*Ex. 4 is a comparative example

As shown in Table 2, the iron concentration and the cleanliness of the molten tin affect the optical properties of the glass sheets. In order to reduce the reflectance of the bottom surface to below 4.15% and to reduce the difference to the reflectance at the top surface to 0.15%, it was necessary to keep the iron concentration in the molten tin low and to maintain the molten tin clean, as in Example 1.

The bottom surface of the glass sheet in Example 1 was polished for at least 10 μm from its surface, and a sample surface was fabricated by taking away the layer including the trace components diffused thereinto from the molten tin. However, the iron oxide concentration of this sample surface was still 0.15 mass %. This is, because there is a limit, due to noise, in the trace analysis of iron oxide with the above-described quantitative measurement method. It is possible that in Example 1 and Example 3, the concentration of iron oxide near the bottom surface is less than 0.15 mass % (that is, in Table 1, the 0.15 is actually "<0.15").

As shown in Table 2, the correlation between the diffusion components near the bottom surface and the properties of the glass sheet can be understood by an analysis using the EPMA. The quantitative analysis with an EPMA is a suitable means for analyzing whether the object of the present invention has been attained. However, in the analysis by EPMA, when quantifying a layer including a lot of tin oxide or iron oxide, the beam diameter of the electron beam used in the analysis can be focused to only a minimum of about 1 μm. This means, that the information obtained with the EPMA corresponds to an average of about 1 μm diameter. To address this problem and to obtain concentration information at a smaller scale, the Sn concentration distribution from the outermost surface to a depth of 1 μm of the glass sheet in Example 2 was analyzed by a secondary ion mass spectrometer (SIMS).

For the analysis by SIMS, a secondary ion mass spectrometer Phi-6600 by ULVAC-PHI Inc. was used at the following primary ion beam settings: ion type: $O_2^+$, voltage: 4 kV, current: 100 nA, angle of incidence: 60°, irradiated surface area: 200 μm², (detection region is 30% in the middle of the irradiated region), and sputtering rate: 26 nm/min. The SIMS measurement results were converted into Sn mass % in the following manner: A glass into which Sn ions have been implanted and that was polished by 1 mm was used as a reference sample, and the Sn atom density (atoms/cc) in the sample was calculated from the calculated RSF (relative sensitivity factor), the ion intensity of the measured analytical elements and the intensity of the reference ions (principal components). Then, the separately calculated atom density of the glass and the molecular weights were used to convert the atom density of Sn into mass %. As a result, it was confirmed that there is a concentration maximum of Sn between the outermost surface and a depth of 1 μm, and that this maximum concentration is 1.5 mass % (1.9 mass % in terms of $SnO_2$).

Thus, with the glass sheet according to the present invention, there is a concentration gradient of trace components near the bottom surface, so that using analytical means other than EPMA, the maximum value of the concentration of certain elements (compounds) may exceed the value specified in the claims. However, in any case, it is sufficient if, as in Table 2, the maximum value of trace components is evaluated by EPMA, as far as investigating the relation to the influence on the optical properties listed in Table 2 is concerned.

Example 5

Figure 2:
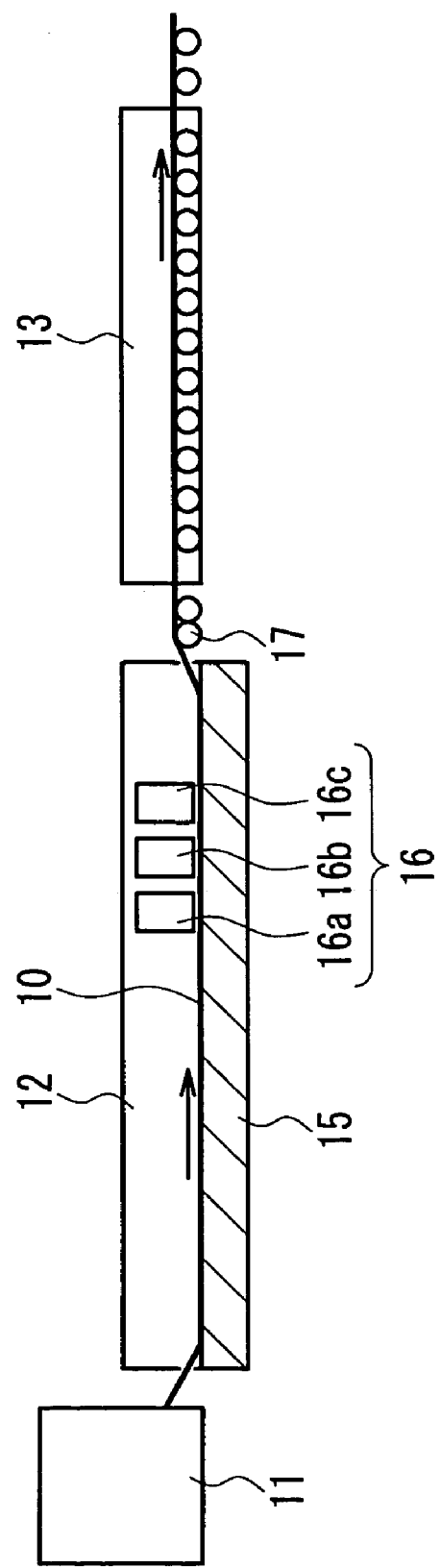
FIG. 2 is a diagram showing the configuration of an apparatus that can be applied to the fabrication of glass sheets in accordance with the present invention.

Using the same device as in FIG. 2, an undercoating film and a transparent conductive film were deposited by online CVD in that order on a glass ribbon. More specifically, the iron concentration in the molten tin was the same as in Example 1, and the ratio of the hydrogen supplied to the tin float bath was set so high that no tin oxide was observed in the molten tin.

From the first coater (16a in FIG. 1) positioned furthest upstream, a gas mixture of dimethyltin dichloride (vapor), oxygen, nitrogen and helium was supplied, and a tin oxide thin film (refractive index: 1.9; first undercoating layer) of 55 nm thickness was deposited on the glass ribbon. Subsequently, a gas mixture of monosilane, ethylene, oxygen and nitrogen was supplied from the second coater (16b in FIG. 1), and a silicon oxide thin film (refractive index: 1.47; second undercoating layer) of 30 nm thickness was deposited on the first undercoating layer. Moreover, using the third coater (16c in FIG. 2) arranged on the downstream side, a gas mixture of stannic chloride (vapor), water vapor, nitrogen, helium and hydrogen fluoride was supplied at a glass temperature of 630° C., and a transparent conductive film made of $SnO_2$: F (refractive index: 1.9; film of tin oxide doped with fluorine) of 750 nm thickness was deposited.

For the resulting Example 5, as for Examples 1 to 4, the transmittance at 540 nm and the transmittance 450 nm before and after 6 hours of irradiation of UV light as specified in the radiation-proofing test according to JIS 212 were measured, and all transmittance changes were almost the same as in Example 1. Moreover, the sheet resistance of the glass of Example 5 was 10 Ω/□, and the haze ratio was 12%. These values are preferable for glass sheets for photoelectric conversion devices.

As explained above, with the present invention, it is possible to obtain a glass sheet for photoelectric conversion devices that is preferable for solar cells or the like, in which the reflectance of the glass surface is kept low, and the inherent transmittance possessed by the glass can be sufficiently taken advantage of.

The invention claimed is:

1. A glass sheet formed on molten tin,
wherein a difference between a visible light reflectance of a surface formed in contact with the molten tin and a visible light reflectance of a surface on the opposite side thereof is not greater than 0.25%;
wherein, when the glass sheet's thickness is 4 mm, a light transmittance at 540 nm wavelength is at least 91.5%, and a light transmittance of at 450 nm wavelength is at least 91.0%, and wherein after irradiating UV light for 6 hours as specified in the radiation-proofing test according to Japanese Industrial Standard (JIS) R3212, a light transmittance at 540 nm wavelength is at least 91.0% and a light transmittance at 450 nm wavelength is at least 90.5%;
wherein a maximum value of tin oxide concentration in terms of $SnO_2$, in the glass sheet at a depth of up to 10 μm from the surface formed in contact with the molten tin, measured by a wavelength dispersive X-ray detector (WDX) mounted to an electron probe micro-analyzer (EPMA), is not greater than 1 mass %; and
wherein a maximum value of iron oxide concentration in terms of $Fe_2O_3$, in the glass sheet at a depth of up to 5 μm from the surface formed in contact with the molten tin, measured by a wavelength dispersive X-ray detector (WDX) mounted to an electron probe micro-analyzer (EPMA), is not greater than 0.2 mass %.

2. The glass sheet according to claim 1, wherein said difference of the visible light reflectance is not greater than 0.15%.

3. The glass sheet according to claim 1, wherein both the visible light reflectance of a surface formed in contact with the molten tin and the visible light reflectance of a surface on the opposite side thereof is not greater than 4.5%.

4. The glass sheet according to claim 3, wherein both the visible light reflectance of a surface formed in contact with the molten tin and the visible light reflectance of a surface on the opposite side thereof is not greater than 4.25%.

5. The glass sheet according to claim 1, wherein, in a rest without a portion up to a depth of 10 pm from the surface formed in contact with the molten tin, the glass sheet has a composition with an amount of iron oxide total in terms of $Fe_2O_3$ that is not greater than 0.04 mass %.

6. The glass sheet according to claim 5, wherein the composition is substantially free from cerium oxide.

7. The glass sheet according to claim 5, wherein the composition includes, in mass %:
65 to 80% $SiO_2$,
0 to 5% $Al_2O_3$,
0 to 10% MgO,
5 to 15% CaO,
10 to 18% $Na_2O$,
0 to 5% $K_2O$,
5 to 15% MgO+CaO,
10 to 20% $Na_2O+K_2O$,
0.05 to 0.3% $SO_3$, and
0 to 5% $B_2O_3$.

8. A glass sheet for a photoelectric conversion device comprising the glass sheet according to claim 1 and a conductive film deposited on that glass sheet.

9. The glass sheet for a photoelectric conversion device according to claim 8, wherein the conductive film is deposited on the surface opposite from the surface formed in contact with the molten tin.

10. The glass sheet for a photoelectric conversion device according to claim 8, further comprising an undercoating film disposed between the glass sheet and the conductive film.

11. The glass sheet according to claim 1, wherein the glass sheet is formed on the molten tin in a float bath in an atmosphere such that formation of the tin oxide in the molten tin is suppressed by maintaining a ratio of hydrogen gas to nitrogen gas in the atmosphere of the float bath at a level in which no tin oxide is found in the molten tin.

12. The glass sheet according to claim 1, wherein the iron concentration in the molten tin is less than 100 ppm.

13. The glass sheet according to claim 12, wherein the iron concentration in the molten tin is less than 95 ppm.

14. The glass sheet according to claim 12, wherein the iron concentration in the molten tin is less than 90 ppm.

* * * * *

UNITED STATES PATENT AND TRADEMARK OFFICE
CERTIFICATE OF CORRECTION

PATENT NO. : 7,087,307 B2 Page 1 of 1
APPLICATION NO. : 10/485633
DATED : August 8, 2006
INVENTOR(S) : Nagashima et al.

It is certified that error appears in the above-identified patent and that said Letters Patent is hereby corrected as shown below:

Title page, and column 1, title: "GLASS SHEET AND GLASS SHEET PHOTOELECTRIC CONVERTER DEVICE" should read --GLASS SHEET AND GLASS SHEET FOR PHOTOELECTRIC CONVERSION DEVICE--

Signed and Sealed this

Thirteenth Day of February, 2007

JON W. DUDAS
*Director of the United States Patent and Trademark Office*